United States Patent
Boggs et al.

(10) Patent No.: US 9,263,901 B2
(45) Date of Patent: Feb. 16, 2016

(54) SECONDARY SERVICE PORT FOR HIGH VOLTAGE BATTERY PACKS

(71) Applicant: Tesla Motors, Inc., Palo Alto, CA (US)

(72) Inventors: Brian Stuart Boggs, Menlo Park, CA (US); Joseph Michael Darragh, San Francisco, CA (US); Mark D. Goldman, Mountain View, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 421 days.

(21) Appl. No.: 13/784,458

(22) Filed: Mar. 4, 2013

(65) Prior Publication Data
US 2013/0307478 A1  Nov. 21, 2013

Related U.S. Application Data (60) Provisional application No. 61/649,293, filed on May 19, 2012, provisional application No. 61/662,913, filed on Jun. 21, 2012.

(51) Int. Cl.
*H02J 7/00* (2006.01)
*B60L 3/00* (2006.01)

(52) U.S. Cl.
CPC ........... *H02J 7/0029* (2013.01); *B60L 3/00* (2013.01); *B60L 3/0046* (2013.01); *H02J 7/007* (2013.01); *H02J 7/0042* (2013.01)

(58) Field of Classification Search
USPC .................................................. 320/109, 112
See application file for complete search history.

(56) References Cited

U.S. PATENT DOCUMENTS

| | | | |
|---|---|---|---|
| 7,598,700 B2 * | 10/2009 | Elder et al. | 320/106 |
| 2009/0023053 A1 | 1/2009 | Berdichevsky et al. | |
| 2009/0096410 A1 * | 4/2009 | Sakurai | 320/109 |
| 2010/0075213 A1 | 3/2010 | Mehta et al. | |
| 2010/0136391 A1 | 6/2010 | Prilutsky et al. | |
| 2010/0136413 A1 | 6/2010 | Hermann et al. | |
| 2010/0138178 A1 | 6/2010 | Paryani et al. | |
| 2010/0273034 A1 | 10/2010 | Hermann et al. | |
| 2010/0315040 A1 * | 12/2010 | Sakurai | 320/109 |
| 2011/0174556 A1 | 7/2011 | Hermann et al. | |
| 2012/0013341 A1 | 1/2012 | Hermann et al. | |
| 2012/0034497 A1 | 2/2012 | Hermann et al. | |
| 2012/0041628 A1 | 2/2012 | Hermann et al. | |
| 2012/0111444 A1 | 5/2012 | Hermann et al. | |
| 2012/0111445 A1 | 5/2012 | Hermann | |
| 2012/0153901 A1 | 6/2012 | Hermann et al. | |
| 2013/0179012 A1 | 7/2013 | Hermann et al. | |
| 2013/0196184 A1 | 8/2013 | Faass et al. | |

FOREIGN PATENT DOCUMENTS

EP   2330661 A1   6/2011
WO   2011142373 A1   11/2011

OTHER PUBLICATIONS

Yinjiao Xing, et al., Battery Management Systems in Electric and Hybrid Vehicles, Energies 2011, No. 4, p. 1840-57.

* cited by examiner

*Primary Examiner* — Robert Grant
(74) *Attorney, Agent, or Firm* — J. Richard Soderberg (57) ABSTRACT

A system and method for providing energy management and maintenance of a high energy battery pack that does not require installation of the battery pack into an operational EV. A secondary service port is provided to enable certain maintenance operations while by-passing battery pack interlocks and protection mechanisms used when the battery pack is installed into an operating environment.

13 Claims, 8 Drawing Sheets

SECONDARY SERVICE PORT FOR HIGH VOLTAGE BATTERY PACKS

CROSS REFERENCE TO RELATED APPLICATIONS

This application claims benefit of U.S. patent application Ser. No. 61/649,293 filed 19 May 2012 and of U.S. Patent Application No. 61/662,913 filed 21 Jun. 2012, the contents of which are expressly incorporated in their entireties by reference thereto for all purposes. This application is related to U.S. patent application Ser. No. 13/784,437 entitled "METHOD AND SYSTEM FOR SERVICING HIGH-VOLTAGE BATTERY PACKS" filed concurrently herewith and is related to U.S. patent application Ser. No. 13/784,542 entitled "SELF-DISCHARGE FOR HIGH-VOLTAGE BATTERY PACKS" filed concurrently herewith, the contents of both are hereby expressly incorporated in their entireties by reference thereto for all purposes.

FIELD OF THE INVENTION

The present invention relates generally to charging and discharging energy storage systems, and more specifically, but not exclusively, to energy maintenance and management of high-voltage battery packs useable in electric vehicles (EV) through a service port.

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Battery packs used with electric vehicles store large amounts of energy in a small space, producing high energy densities. These battery packs include an external housing that is designed for more than just environmental protection and packaging efficiency. The housing also enhances safety and stability, particularly under a range of anticipated abnormal operating conditions.

Due to the high energy densities involved, it is known to provide internal safety mechanisms to help ensure that stored energy is controllably released under a narrow set of circumstances. These safety mechanisms interact with mechanical and electrical interfaces provided by an operational vehicle to enable energy charging and discharging.

There are a wide range of situations where energy maintenance and management of a battery pack is needed, and not all of these include situations where the battery pack is installed in a vehicle or a vehicle known to be 100% operational. Some of these situations include storage, transport, and recycling of a high energy battery pack where the battery pack is not installed in an EV. Other situations include operations on a battery pack that is installed in an EV, but the circumstances indicate that operation of the EV, or a subsystem thereof, may be degraded. Degradation may occur from collisions or acts of nature and could compromise a safety system of the battery pack. Even when the safety system is not actually compromised, the state of the vehicle or its environment or status may indicate that there is a risk that the safety system has been compromised. In those situations, it may not be reasonable to expect that the vehicle may be available to provide the necessary interface and safety structures. Of course, there are also situations where maintenance and management operations are needed with respect to a fully functional EV and battery pack.

Maintenance and management operations include charging and discharging a battery pack safely to desired state of charge (SOC) levels. Depending upon the situation, the desired SOC level could require a discharging or a charging operation. Under some circumstances, it is necessary or desirable to perform the operation without benefit of the battery pack being installed into an EV, nor is it always economical or possible in every case to provide an operational EV into which the candidate battery pack may be installed.

One of the incorporated co-pending patent applications includes a discussion of a charging/discharging tool that advantageously under certain circumstances has access to a high-voltage battery pack through a secondary service connection. Sometimes it is the case that the primary service connection is unavailable while there is significant stranded energy present. These cases may include damage to the primary service connection, internal fault with the energy storage system, and/or damaged or defective internal connections.

Even in situations when the primary service connection is available, use of a charging/discharging tool through this connection may add undesired costs and complexities under some scenarios. In order to operate the primary service connection typically used by an electric vehicle, the charging/discharging requires costly CAN communication, special connectors, time to disconnect the vehicle electrical connector and install the connector to the external device, and configuration/use of any simulator to emulate conditions of the operating environment in cases where there is are failsafe protections inhibiting direct access by such a tool.

An energy storage system installed in an EV with significant stranded energy may be implicated by first responders (e.g., fire fighters, security, and emergency personnel) and second responders (e.g., tow truck drivers, dismantlers, junk yards, and auto-salvagers). Whether there is a need for rapid response or access by persons who may lack monetary resources, training, or technical background to address the stranded energy through the primary service connection using a specialized and sophisticated charging/discharging tool, it can be problematic when access the energy storage system is limited.

What is needed is an apparatus and method for providing energy management and maintenance of a high energy battery pack through use of a secondary service port.

BRIEF SUMMARY OF THE INVENTION

Disclosed is a system and method for providing energy management and maintenance of a high energy battery pack through use of a service port. There is a need to manage battery packs that have been removed from their operating environment (e.g., an EV) due to some loss of normal functionality and the secondary service port is one modality for meeting that need, for the battery pack out of, or installed in, its operating environment.

The following summary of the invention is provided to facilitate an understanding of some of technical features related to energy management and maintenance of a high energy battery pack, and is not intended to be a full description of the present invention. A full appreciation of the various aspects of the invention can be gained by taking the entire specification, claims, drawings, and abstract as a whole. The present invention is applicable to battery packs whether installed into an operating environment, as well as other operating environments in addition to the EV environment.

A rechargeable high-voltage battery pack, including: a plurality of series-coupled energy storage elements; an interlock having a first node and a second node, the first node coupled to the plurality of series-coupled energy storage elements with the interlock responsive to a control signal to control a power communication of the first node to the second node, the interlock enabling the communication with the control signal in a first mode and the interlock disabling the power communication with the control signal in a second mode; a housing enclosing and sealing the plurality of series-coupled energy storage elements and the interlock with a plurality of exterior walls; an operational port coupled to a portion of a first particular one exterior wall of the plurality of exterior walls, the operational port coupled to the second node and providing a first energy transfer with respect to the plurality of series-coupled energy storage elements only when the power communication is enabled; and a service port coupled to a portion of a second particular one exterior wall of the plurality of exterior walls, the service port coupled to the first node and providing a second energy transfer with respect to the plurality of series-coupled energy storage elements without regard to whether the power communication is enabled.

A method for managing a rechargeable high-voltage battery pack, including: a) configuring the rechargeable high-voltage battery pack to transfer energy with respect to an exterior operational port through an interlock; and b) bypassing the interlock to transfer energy between the rechargeable high-voltage battery pack and an exterior service port without using the operational port to transfer energy relative to the rechargeable high-voltage battery pack.

Embodiments include a method and system for charging and discharging high-voltage battery packs when the supporting operating environment (e.g., an EV) is not operational and it is not known whether the battery pack is operating properly or has been compromised due to external damage, internal failure of batteries or other similar situations.

Some of the disclosed embodiments define and include a dedicated service port that allows for an electrical connection to the battery pack that is independent of CAN communication, separate from the electrical connection to the operating environment, and not required to simulate the some aspect of that environment (e.g., drivetrain electrical signature). A dedicated service port with direct access to a cell side of battery contactors of the battery pack would also simplify the complexity of an external discharge tool to allow it to more easily work across multiple vehicle designs.

Some embodiments of the present invention include one or more of:
1) A configuration allowing access to battery high voltage independent of BMS controls, contactors, or relays, such for a) discharging non-functional battery;
    b) checking isolation of non-functional battery; and c) checking SOC of non-functional battery;
2) An inline diode or other current-flow-direction control on either or both a positive side or negative rail to only allow discharge (and thereby preventing a dangerous overcharging condition of the battery pack);
3) An inline fuse to limit discharge rate on either or both the positive side or negative rail;
4) A Thermal control feature for heat generated by inline diode rejecting heat to a thermal mass of high voltage conductors, battery enclosure, or battery liquid or air cooling loop;
5) A tamper evident seal securing the service port to minimize non-intended use(s);
6) An interface paradigm to the service port that requires special tools to access to reduce non-intended use(s);
7) A dynamic/reactive seal for the service port to secure it during non-active use, thereby reducing moisture or foreign object ingress; and
8) An interface paradigm that grounds a chassis of the battery pack upon engagement of the service port interface (e.g., insertion of a plug of a service unit into a receptacle of the service port) prior to making electrical contact with pins coupled to stored energy.

Some embodiments include tamper-evidence technology to minimize or prevent general use of or tampering with the service port because improper use of the service port may damage the battery pack or otherwise be a basis for voiding a warranty associated with the operating environment. Embodiments of the present invention contemplate use of the service port in association with specific service actions. A tamper evident label and/or use of warning technology discourage non-authorized use.

Depending upon implementation, some embodiments provide an external device with electrical access to an otherwise sealed, non-operational battery: i) after a crash event to remove stranded energy; ii) prior to transport (shipment) to reduce the amount of stored energy or to meet regulatory requirements; iii) prior to remanufacturing to reduce a working voltage or to reduce an amount of stored energy; and iv) in other scenarios where an SOC or isolation resistance of the energy storage system is to be determined. A service port enables these operations without regard to whether a functional battery pack is installed in an intact operating environment.

The electrical connection typically used by the vehicle may no longer be operational due to physical damage, an internal battery fault, or damaged or defective relays or contactors internal to the battery.

Any of the embodiments described herein may be used alone or together with one another in any combination. Inventions encompassed within this specification may also include embodiments that are only partially mentioned or alluded to or are not mentioned or alluded to at all in this brief summary or in the abstract. Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Embodiments of the present invention provide a system and method for providing energy management and maintenance of a high energy battery pack installed in an EV through use of a service port. The following description is presented to enable one of ordinary skill in the art to make and use the invention and is provided in the context of a patent application and its requirements.

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

A battery service unit capable of simulating an operating environment of a high-voltage battery pack (e.g., simulating an EV) to enable charging and discharging of the battery pack has numerous advantages. When the battery pack is not installed in the operating environment, installed in the operating environment under circumstances in which the operating environment may be degraded and possibly unreliable, or installed in an uncompromised environment, the battery service unit enables predictable and safe management and maintenance operations of the SOC.

Rechargeable battery packs require management and maintenance to set desired SOC levels. What the precise SOC level is depends upon the construction and nature of the energy storage elements making up the battery pack (e.g., type(s) of cell chemistry used in battery cells) and what operation the battery pack is expected to perform. For high-voltage battery packs that are assembled from tens, hundreds, and sometimes thousands of Lithium-ion energy storage elements arranged in parallel/series combinations, there are SOC levels and ranges that are optimum for various operations. In some cases, optimum SOC levels are set to minimally impact battery pack life expectancy. In some cases, an optimum SOC level is set to minimize risk of injury to persons and property in the vicinity of a battery pack and persons servicing the battery pack.

Embodiments of the present invention provide a single battery service unit applicable to this wide range of possible scenarios. Other embodiments could be specialized for a limited set of scenarios, and sometimes a single scenario. These scenarios include discharging/charging the battery pack in anticipation of: 1) storage; 2) transportation; 3) recycling; and 4) service. Storage ideally sets the SOC appropriate for maximizing life expectancy. During storage, a battery pack will lose charge and periodically the battery pack will need to be charged to maintain the SOC at the desired level. There are safety guidelines and legal requirements for transportation of a battery pack and the battery service unit is used to set the SOC appropriate for transport. Prior to recycling, it is desirable to remove as much energy as possible from the battery pack. The service scenario includes many different situations, including: a) servicing of the battery pack outside of its operating environment, b) servicing of the battery pack when installed in an operating environment that may be compromised due to an event that has or had the potential to induce damage to the battery pack where the battery pack or the supporting operating environment may be partially or wholly inoperative, and c) servicing of the battery pack in an intact and functioning operating environment.

When the operating environment includes an intact and functional EV, the battery service unit is able to leverage existing hardware/software infrastructure, such as a battery management system, to safely diagnose the state of a vehicle and then proceed to charge or discharge the battery pack as deemed appropriate under the circumstances. In the event the electric vehicle has been in a collision or subjected to other potentially damaging event (e.g., flooding), the battery service unit is used by a responder or other service professional to safely discharge the battery pack. Use of the battery service unit places the battery pack in a safer state allowing the vehicle to be moved or repaired with decreased risk.

Additionally, some embodiments of the battery service unit may also be used by service professionals to provide routine services related to maintenance and management of the EV. The battery service unit may include programmatic steps that guide the service professional through various functions for ensuring the battery pack is charged to proper levels and the battery management system is working correctly.

In the discussion herein, embodiments of the present invention are described as determining a desired SOC level and automatically setting an SOC level of an energy storage system to the desired SOC level. In some scenarios, the embodiments rely on an operating environment of the energy storage system to provide the current SOC information, and in other instances an external service unit determines (through measurement, calculation, or estimation) the current SOC level. Some embodiments transfer energy with respect to the ESS to automatically set the actual SOC level to the desired SOC level within a predetermined threshold.

The following discussion also includes reference to high voltage and high energy. In the context of the present invention, high voltage is a voltage exceeding 40 V. High energy in this context includes battery packs storing 10 kWh or more, though other embodiments may define high energy with a different energy capacity or capacity threshold.

Figure 1:
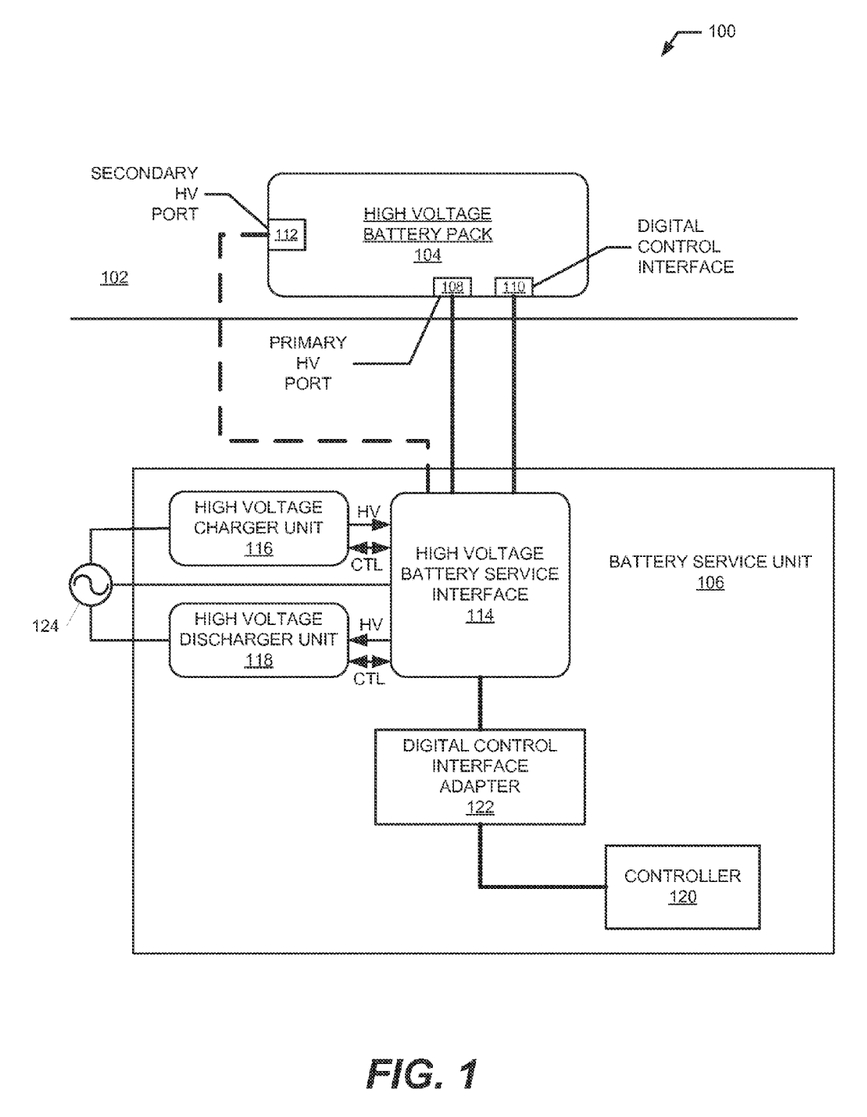
FIG. 1 is a block diagram illustrating schematically an electric vehicle having a high-voltage battery pack coupled to a battery service unit in accordance with some embodiments of the present invention.

FIG. 1 illustrates schematically an operating environment 100 including an electric vehicle (EV) 102 having a high-voltage battery pack 104 coupled to a battery service unit 106. Operating environment 100 is relevant to scenarios including fully intact EV 102 as well as situations in which EV 102 may be partially or wholly compromised. EV 102 includes a primary high-voltage (HV) port 108 for energy transfer and an associated digital control interface 110 as well-known. Primary HV port 108 provides a standard electromechanical interface for safely transferring charging energy from a charging station to battery pack 104. Associated with primary HV port 108 is digital control interface 110 for use by the charging station to monitor and control charging. Battery service unit 106 includes a complementary electromechanical interface to access battery pack 104 through primary HV port 108 and digital control interface when they are available and operational.

Figure 7:
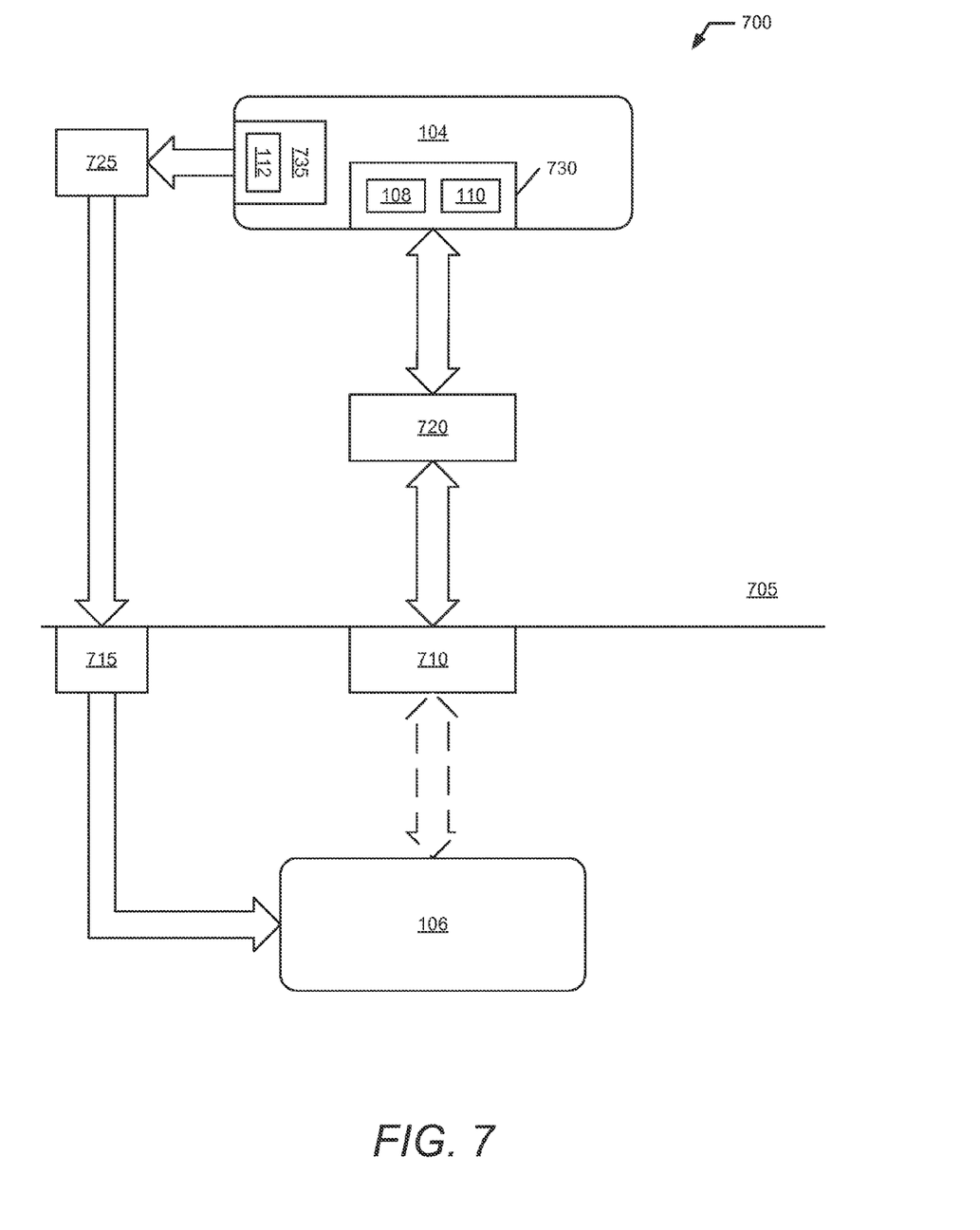
FIG. 7 illustrates an energy management scenario for a high-voltage battery pack installed into an operating environment.

EV 102 further includes a secondary HV port 112 for direct management and maintenance access to battery pack 104. There are many possible implementations for the electromechanical interface of secondary HV port 112 and its interaction with battery pack 104. Some of the interface components and interactions are described herein. The discussion herein including the description of FIG. 7 provides further details of a representative secondary HV port 112.

Battery service unit 106 includes a high-voltage battery service interface 114 coupled to a high-voltage charger unit 116 through a high-voltage connection (HV) and control line (CTL) such as RS-232 communication protocol. In addition, battery service unit 106 further is coupled to a high-voltage discharger unit 118 also through a high-voltage (HV) connection and another control line (CTL) such as a digital communication interface like CAN-IO (Controller Area Network Input/Output), widely used in the automotive industry. An optional controller 120 (e.g., a computer or the like) interacts with battery service interface 114 using a digital control interface adapter 122 that also may produce signals compatible with CAN-IO. Instructions executing on controller 120 oversee operation of high-voltage battery pack 104 as well as charger unit 116 and discharger unit 118, as appropriate. Controller 120 may be integrated into battery service unit 106 in addition to implementations including an external element. Battery service unit 106 may include interface elements providing some control capability of battery service interface 114, charger unit 116, and discharger unit 118 independent of controller 120.

Charger unit 116 operates as a conventional charger appropriate for battery pack 104. Embodiments of the present invention provide a maximum charging rate of 1 kW, though other implementations may provide other charging rates. Discharger unit 118 includes energy dissipative and/or transformative elements (e.g., resistors) that absorb energy discharging from battery pack 104 using battery service unit 106 without damage or risk of injury. Embodiments of the present invention provide a maximum discharging rate of 10 kW, though other implementations may provide other discharging rates.

In the embodiment of FIG. 1, battery service unit 106 receives operational power from a power source 124. Power source 124 includes AC line power (e.g., grid or generator power) and DC battery power to power and control battery service unit 106. Battery service unit 106 is designed to support the wide range of scenarios and situations described herein and as such, some of those situations do not include predictable and easy access to stored energy of battery pack 104 (assuming that there is sufficient energy stored in the battery pack). To ensure that battery service unit 106 is useable in any context, it includes its own power source. In some implementations, battery service unit 106 may be powered, or charged, in whole or part by energy from battery pack 104.

An embodiment of battery service unit 106 includes: 1) a discharger (a fixed resistive load bank or an electronic load); 2) a variable voltage constant current or constant voltage power supply; 3) a controller; 4) a drive Inverter Simulator (e.g., capacitor); 5) an active discharge circuit for onboard capacitors—a. has redundant circuits for safety and reliability and b. automatically triggered via E-Stop, or when any HV cable is disconnected; 6) a passive discharge circuit for onboard capacitors; 7) a current sensor; 8) a method to protect contactors from opening under load; 9) a user configurable SOC (state-of-charge); 10) a method to conduct a Capacity Test; 11) a method to charge or discharge a battery to an appropriate level per regulatory shipping requirements; 12) an over voltage protection; 13) an under voltage (over discharge) protection; 14) an over temperature protection; 15) a voltage measurement display; and 16) status LED indicators.

Other features of selected embodiments of the present invention include: 1) a configurable HV bus capacitance (allows the battery service unit to work with batteries from a variety of powertrains); 2) a configurable low-voltage input board—a. low voltage signals vary from product to product: different connectors, different voltages, different expected resistances, by having a configurable and expandable low voltage input to the battery service unit it is capable of handling multiple products with only a different cable attachment; 3) all relays, sensors, and internal devices controlled over CAN (allows easy communication from one device to the next as the CAN messages are changed as necessary); 4) may be implemented as a mobile product, to allow deployment at vehicle service centers or roadside assistance (post vehicle crash event for example) or throughout a storage facility and the like; 5) a configurable voltage range to work across battery product lines; and 6) implemented as a module discharge system to work across battery product lines.

A general description of operation includes battery service unit 106 coupling to battery pack 104 (whether installed or non-installed in an operating environment) and auto-charging/discharging battery pack 104 to a predefined user determined SOC level.

In FIG. 1, the embodiment is illustrated as having direct functional connections between HV battery pack 104 and battery service unit 106. In various implementations, there may be one or more wiring harnesses and connectors (for example, at the signal/mechanical interfaces of EV 102).

Figure 2:
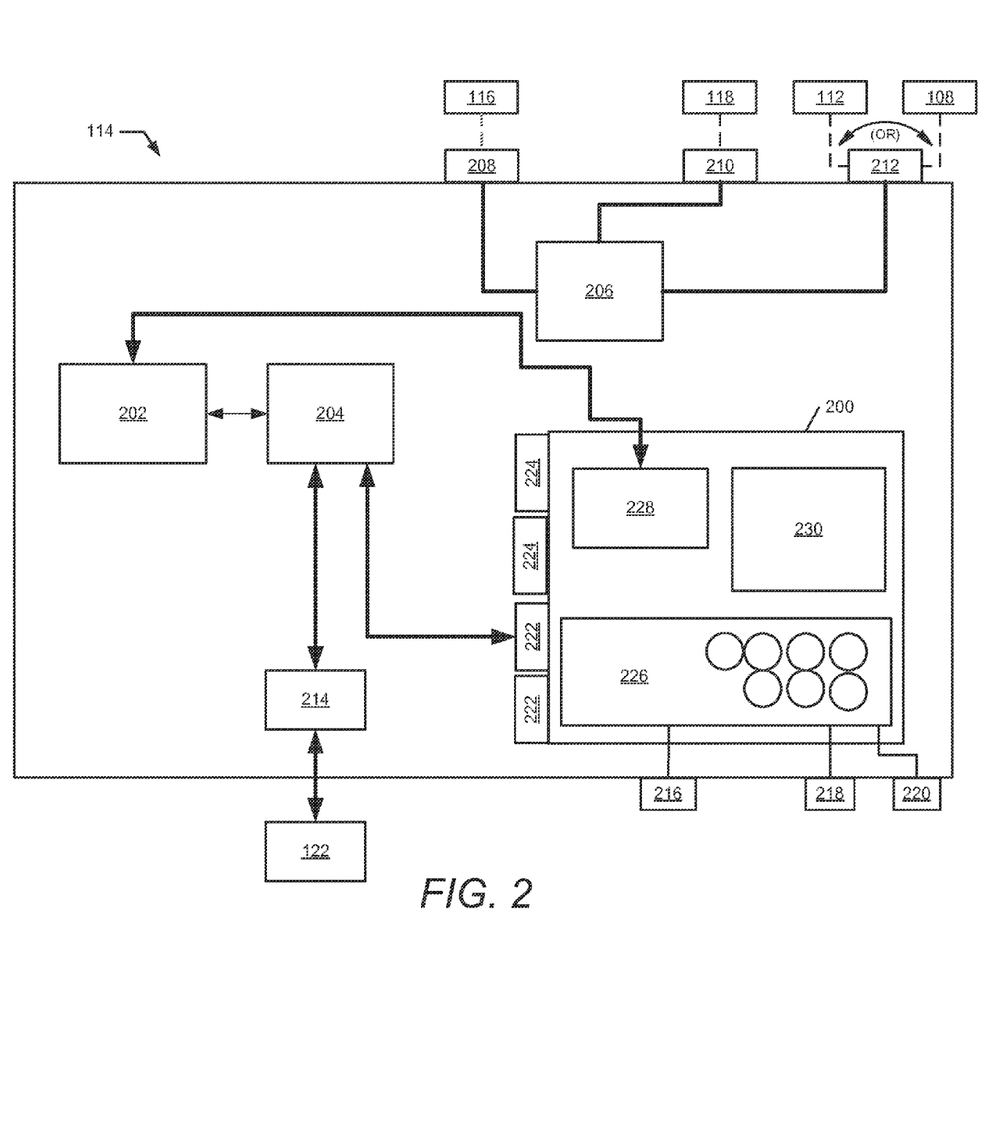
FIG. 2 is another block diagram illustrating schematically selected subcomponents in a high-voltage battery service interface used in the battery service unit in accordance with some embodiments of the present invention.

FIG. 2 illustrates schematically selected subcomponents of high-voltage battery service interface 114 illustrated in FIG. 1. High-voltage battery service interface 114 includes a high-voltage battery service communications interface 200, a digital control signaling module 202, a digital control interface switch 204, a set of high-voltage terminals 206, and various interconnects to other systems including a high-voltage power supply connector 208, a high-voltage load bank connector 210, a high-voltage primary/secondary HV port connector 212 for connection to high-voltage battery pack 104, a digital I/O module 214 for connection to adapter 122 (e.g., a dongle), and a digital control interface port 216. The connection to the personal computer uses digital I/O module 214 having a USB (universal serial bus) connection to controller 120 and a digital I/O connection to high-voltage battery service communications interface 200 compatible with the CAN-IO standard or similar protocol. High-voltage battery service interface 114 includes a digital control interface port 216, an emergency shut-off switch 218, and an on-off switch 220, as well as one or more internal digital I/O connectors 222 and one or more external digital I/O connectors 224.

Interface 200 further includes an operating environment simulator 226, a set of charge/discharge relays 228, and a high-voltage discharge logic and load 230. Simulator 226 is implementation specific and includes a combination of components that create an electrical characteristic composite or "signature" matching the intended operating environment of battery pack 104, such as an EV. Simulator 226 mimics the operating environment and provides battery pack 104 with the necessary interface elements (e.g., electrical signals and loads) to enable battery pack 104 to transition into an operational mode. For example, battery pack 104 commonly includes internal contactors that must be powered and set into a particular configuration before battery pack 104 may transfer energy. Simulator 226 enables battery service unit 106 to operate such high-voltage contactors so charging or discharging may be possible. In some embodiments, simulator 226 includes various capacitors and/or inductors matching the impedance of the operating environment and, when combined with predetermined resistors within battery pack 104, producing time constants that may be identified with a particular vehicle. Battery pack 104 is receptive to receiving various commands once it is in the operational mode. In the implementation illustrated in FIG. 2, simulator 226 is capable of being reconfigured to simulate different operating environments.

In operation, high-voltage battery service communications interface 200 receives low-voltage inputs from battery pack 104 over digital control interface port 216 once communication is established. In some embodiments, controller 120 may send digital commands over digital control interface switch 204 and to digital control signaling module 202 to toggle status in the battery pack indicating the car is in a specific state (e.g., a "DRIVE" state), without regard to whether the operating environment is currently able to support the specific state. Charging battery pack 104 may be achieved by enabling connectors to high-voltage power supply connector 208 while discharging may occur through enabling connectors to high-voltage load bank connector 210, typically one or several banks of resistors maintained in a separate enclosure along with fans or other heat dissipation subcomponents.

Figure 3:
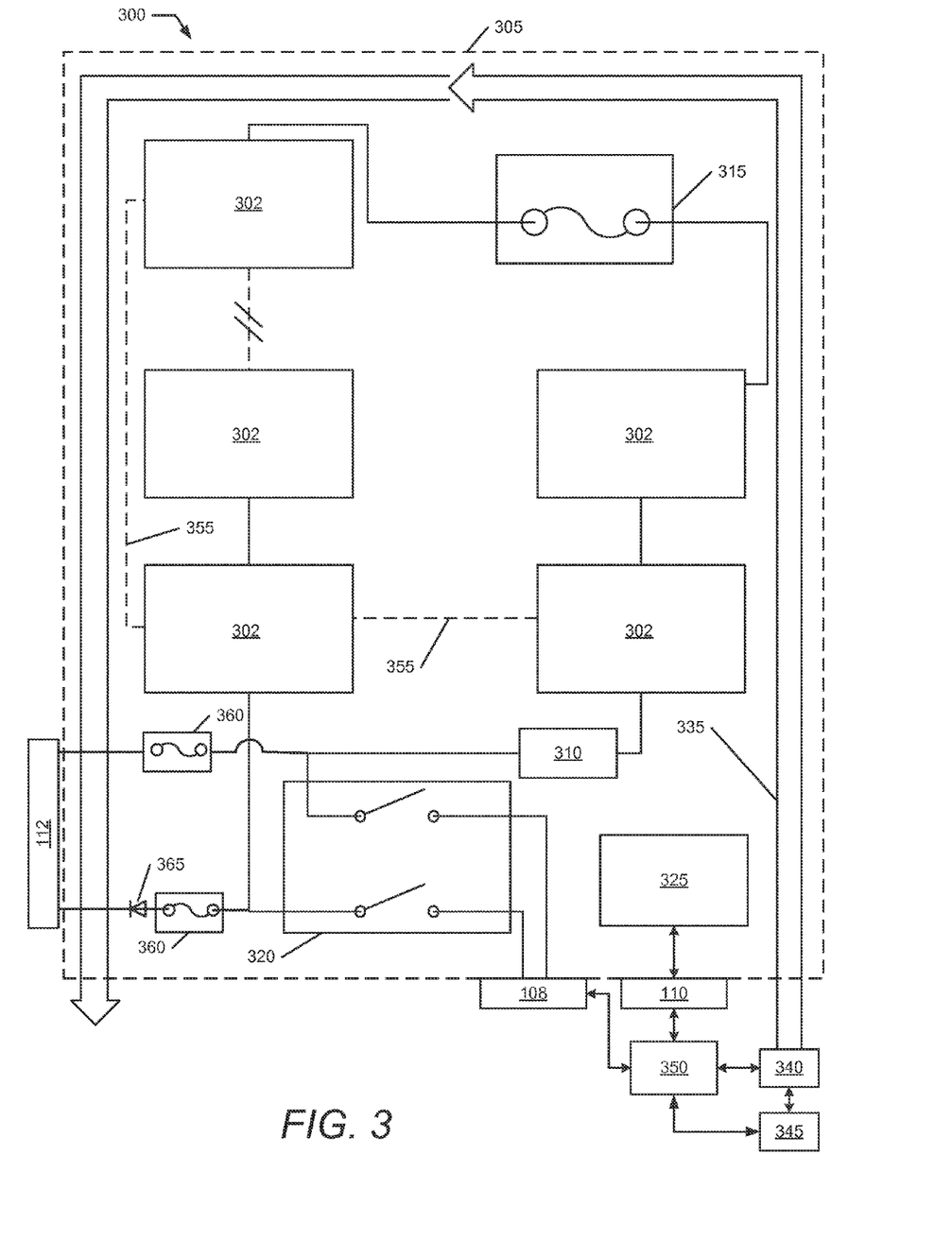
FIG. 3 is a schematic design of a battery pack including a primary HV port and a secondary HV port used by the battery service unit in accordance with some embodiments of the present invention.

FIG. 3 illustrates a schematic design for a battery pack including a primary HV port and a secondary HV port used by the battery service unit in accordance with some embodiments of the present invention. FIG. 3 illustrates a battery pack 300 including a plurality of electrically-serially-coupled battery modules 302 contained within a high-voltage battery enclosure 305. Battery pack 300 further includes a current sensor 310, a fuse 315, a set of contactors 320, a battery management system (BMS) 325, a primary power connector (e.g., primary HV port 108), a control interface (e.g., digital control interface 110) and secondary power connector (e.g., secondary HV port 112). Enclosure 305 typically provides a structural\environmental container (sometimes hermetically closed or semi-sealed) for battery pack 300 components. Battery pack 300 often includes a coolant distribution system (generically represented by coolant loop 335 and pump 340) isolated and insulated from the battery pack 300 components and configured to control their temperature. As will be further described herein, pump 340 (or other coolant controller) is preferably powered by energy from an auxiliary energy storage system 345 (typically a 12V battery) different from battery pack 300. Interrupting available energy from battery pack 300 would interrupt coolant flowing in coolant loop 335 without use of auxiliary energy storage system 345. For ease in explanation, a discrete controller 350 is also shown for interfacing with BMS 325, pump 340, and auxiliary energy storage system 345 to control the detection and response modalities of the preferred embodiments. Controller 350 may be integrated into other control functions in some embodiments.

Battery pack 300 may include any number of modules 302 different from the five shown in FIG. 3. Modules 302 are serially-coupled inside enclosure 305 with a series path shown in solid lines. In series with serially-coupled modules 302 is current sensor 310, fuse 315, and contactors 320. Current sensor 310 measures series current in battery pack 300. When battery pack 300 is working properly, all modules 302 exhibit the same current and current sensor 310 indicates this value. Fuse 315 is disposed in this series path and is designed to protect against over current conditions.

Contactors 320 are switching systems for selectively communicating modules 302 to an external load through the primary power connector. Battery management system (BMS) 325 controls contactors 320 and includes controllers and sensors for measuring and determining desired parameters (e.g., operating and SOC characteristics and the like) of battery pack 300. As previously mentioned, BMS 325 will generally close contactors 320 when battery service unit 106 provides a proper electrical signature of an appropriate operating environment. The provision of the signature causes the BMS 325 to operate as if battery pack 300 is actually installed in a valid and intact operating environment. The secondary power connector, optionally also coupled to the "cell side" of contactors 320, are used as an alternative energy access port (e.g., the secondary HV port/service port described herein). In some embodiments, the secondary power connector is used to provide a service access port for direct charging and/or discharging operations of battery pack 300 such as when some or all portions of the battery pack 300 are compromised and/or when BMS 325 also is not operable and cannot close contactors 320.

Battery pack 300 further includes current protection devices 360 (e.g., fuses) limiting energy flow relative to the secondary power connector 332. Some embodiments further include a diode 365 or the like to limit energy flow in one direction, such as ensuring that the alternative energy access port may be used for one of charging or discharging only.

While great care is used in designing, manufacturing, and testing battery pack 300, sometimes it is the case that an internal short 355 may develop among one or more of the series elements. In some cases, these shorts may be the result of a vehicle being in a collision, a catastrophic event (natural or man-made), or general wear or failure. Representative internal shorts 355 are shown in dashed lines in FIG. 3, but it is understood that internal shorts may develop elsewhere, including internal shorts contained within a series stackup of module 302. One or more of the implicated series elements sourcing current through internal short 355 contribute current through the intended series path as well as through internal short 355. These series elements can thus begin to exhibit sustained high levels of current that may lead to component over-temperature, failure, and sometimes a hazard. This is sometimes further complicated as the object(s) which formed all or part of the short circuit may also create dangerous heat/temperatures.

Internal short 355 may occur between adjacent high voltage (HV) chain components at different potentials or through the conductive, isolated enclosure in the case that isolation is lost at two or more points, or through another medium, such as a conductive fluid such as salt water, water, water/glycol mixtures, and the like. An impedance of internal short 355 and a number of series elements affected by internal short 355 determines the short current. In some cases internal short 355 may be intermittent. Internal short 355 will have a heat capacity that also helps determine whether internal short 355 will change its impedance (for example, become open circuit) as internal short 355 dissipates power. In some embodiments, BMS 325 reports these conditions to battery service unit 106 allowing it to determine how to charge or discharge the battery pack 300.

When BMS 325 and battery pack 300 are intact and operating properly, battery service unit 106 connects through the primary power connector. This is advantageous as battery service unit 106 is able to mimic the vehicle's operation in the specific state and utilize BMS 325 to open and close contactors 320 in a safe manner minimizing wear and tear on the battery pack and its components. Other control and safety measures available to the vehicle remain available in this mode of operation.

When BMS 325 and/or battery pack 300 exhibit one or several faults or failures, battery service unit 106 may instead engage connections through the secondary power connector thereby bypassing the controls of BMS 325. While this alternate approach may be necessary in an emergency situation such as a collision or other event, such discharging of the battery pack 300 through the secondary power connector may result in partial or severe damage to the underlying battery cells and interconnections.

Figure 4:
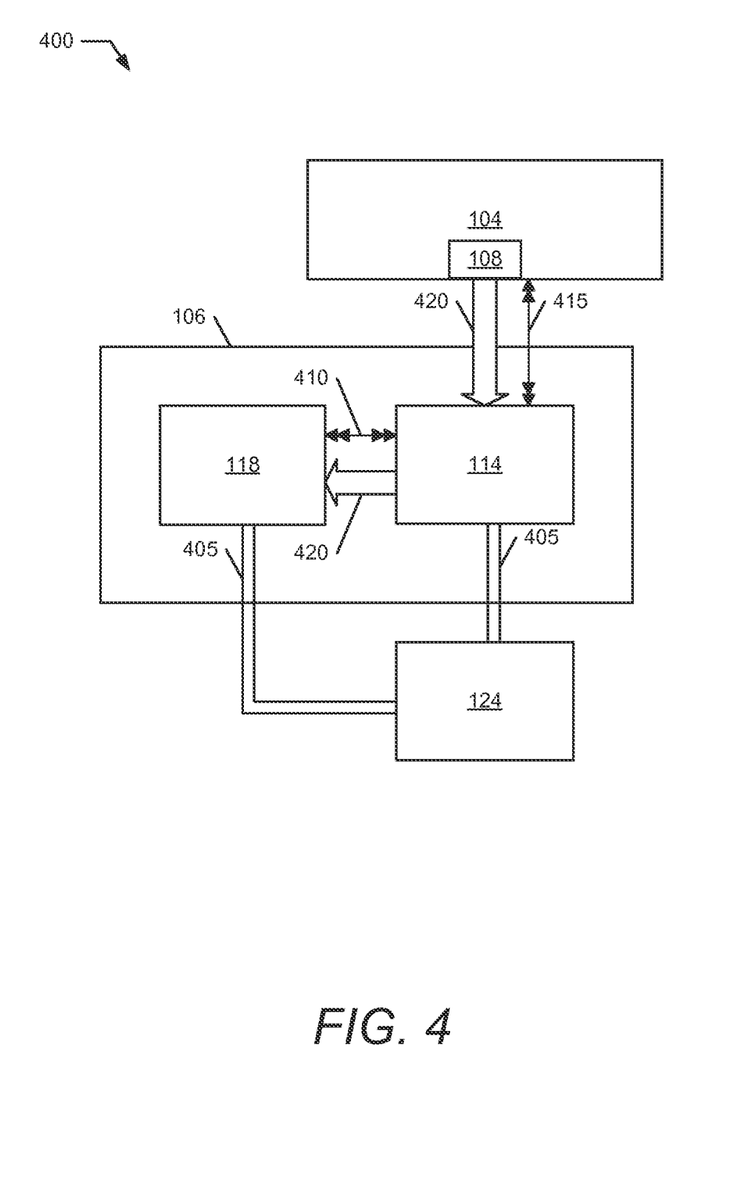
FIG. 4 illustrates an energy transfer for a high-voltage energy pack 104 in an extra-operational environment 400 using the primary charging connector.

FIG. 4 illustrates an energy transfer for a high-voltage battery pack 104 in an extra-operational environment 400 using the primary charging connector. In extra-operational environment 400, battery pack 104 is not installed in its operating environment. Battery service unit 106 is used to automatically set a desired SOC level for battery pack 104. In some embodiments, battery service unit 106 includes preselected scenarios (e.g., storage, ground transportation, air transportation, recycling, emergency discharge, and the like), each having a predetermined associated SOC level. An operator choosing one of the preselected scenarios causes battery service unit 106 to automatically charge/discharge battery pack 104 to the predetermined SOC level associated with the selected scenario.

In FIG. 4, extra-operational environment 400 configures battery service unit 106 to discharge HV energy from battery pack 104. Battery service unit 106 provides operational power (e.g., 120-230VAC) from power source 124 to battery service interface 114 and to discharger unit 118 using power lines 405. Battery service interface 114 issues a remote enable signal to discharger unit 118 using a remote enable signal line 410 and communicates with and controls battery pack 104 using a digital I/O line 415. Depending upon battery pack 104 and the interface method, it may be further necessary for battery service unit 106 to provide simulation information to simulate an operating environment for battery pack 104 before it may be commanded and/or before an initiation of an energy transfer event. High-voltage lines 420 couple battery pack 104 to battery service unit 106 and internally couple battery service interface 114 to discharger unit 118. Battery service unit 106 may charge HV energy into battery pack 104 by coupling charger unit 116 to battery service interface 114 and appropriately setting the control signals. In some cases a different mechanical interface (e.g., wiring harness) may be necessary to couple battery service unit 106 to battery pack 104 for charging.

Figure 5:
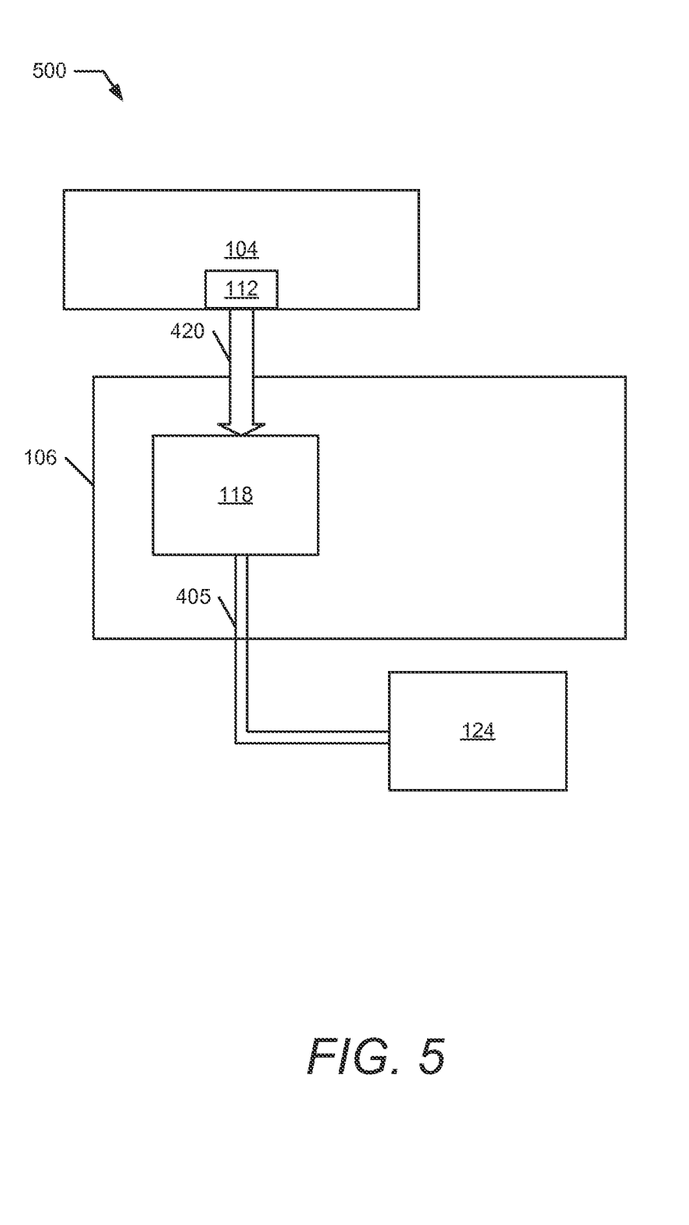
FIG. 5 illustrates an energy transfer for a high-voltage energy pack 104 in an extra-operational environment 500 using the secondary charging connector.

FIG. 5 illustrates an energy transfer for a high-voltage battery pack 104 in an extra-operational environment 500 using the secondary charging connector. In extra-operational environment 500, battery pack 104 is not installed in its operating environment. However the embodiment of FIG. 5 is also applicable to uses in which battery pack 104 is installed into its operating environment but for one reason or another (such as those described herein) the primary charging connector is not used. Battery service unit 106 is used to automatically set a desired SOC level for battery pack 104. In some embodiments, battery service unit 106 includes preselected scenarios (e.g., storage, ground transportation, air transportation, recycling, emergency discharge, and the like), each having a predetermined associated SOC level. These SOC levels are set for controlled SOC charging/discharging with an expectation that battery pack 104 may be operational at conclusion of the charging/discharging event. An operator choosing one of the preselected scenarios causes battery service unit 106 to automatically charge/discharge battery pack 104 to the predetermined SOC level associated with the selected scenario, and when possible, doing so in a way that does not negatively affect future performance (e.g., lifetime). Operational environment 500 further supports an emergency discharge mode in which a primary goal is removal of stranded energy of battery pack 104, sometimes as quickly as possible. Under this mode, risks of damage to battery pack 104 are increased. Some embodiments of the present invention provide more safety features for energy transfer using the primary port and more robust options for energy transfer using the secondary port.

In FIG. 5, extra-operational environment 500 configures battery service unit 106 to discharge HV energy from battery pack 104 directly through discharger unit 118 without simulation or communication with respect to the battery pack. Battery service unit 106 provides operational power (e.g., 120-230VAC) from power source 124 to discharger unit 118 using power line 405. High-voltage lines 420 couple battery pack 104 to battery service unit 106 and internally couple battery service interface 114 to discharger unit 118. Battery service unit 106 may charge HV energy into battery pack 104 by coupling charger unit 116 to battery pack 104 using the secondary HV connector. In some cases a different mechanical interface (e.g., wiring harness) may be necessary to couple battery service unit 106 to battery pack 104 for charging.

The disclosed embodiments of battery service unit 106 anticipate a wider range of uses for discharging a battery pack 104. These uses depend upon whether battery pack 104 and/or its operating environment is intact and operational. For a functional battery pack 104, there are three discharge options: 1) use processes and devices of the operating environment to natively discharge energy which may be automatically commanded by battery service unit 106; 2) battery service unit 106 discharges battery pack 104 as described in FIGS. 4; and 3) battery service unit 106 commands battery pack 104 to self-discharge as described in the incorporated patent application. Options 1 and 2 are configured to have a preferred discharge rate of ~10 kW and a range of discharge rates 1-20 kW (vehicle or load bank) and option 3 has a preferred discharge rate of ~10 W and a range of discharge rates 5-50 kW. In option 1, the operating environment of an EV includes cabin temperature controls (e.g., heater, air conditioner with HVAC compressor), powertrain coolant system, and low voltage loads (e.g., headlights). One or more of these systems may be enabled and actuated by battery service unit 106 to have the operating environment discharge battery pack 104. This is distinguished from option 3. In option 3 the discharging elements are contained within battery pack 104 while in option 1, the discharging elements are outside of battery pack 104 but within its operating environment. Option 2 provides the discharging elements outside of the operating environment. Some implementations may include a combination of options.

While specific details of preferred structures and methods for self-discharge are described in the incorporated self-discharge patent application, in general self-discharge refers to use of power dissipative elements of battery pack 104 to intentionally discharge energy and decrease availability for standard EV operation which is contrary to the typical systems which try to conserve/preserve energy for operational power uses. Battery pack 104 typically includes power conserving features and some embodiments of the present invention include an ability to override or limit the power-conserving features to dissipate power. In some cases the power dissipation is maximized and may compromise or damage battery pack 104 and in other cases the self-discharging power dissipation is maximized while also preserving future operation of battery pack 104. The internal power dissipative elements include processors, transmitters, and other elements that can collectively dissipate significant power when operated in the non-power conserving modes. In some embodiments, for self-discharge of battery pack 104 or when the operating environment uses dissipative elements outside of battery pack 104, the coolant system is enabled as heat is rejected into the circulating coolant to reduce risk of discharging events. In some situations, intentional shorts are created into the coolant in order to induce energy-consuming processes (e.g., hydrolysis).

For a non-functional battery pack 104, there are also three discharge options: 1) battery service unit 106 discharges battery pack 104 as described in FIG. 5 with a preferred discharge rate of ~6 kW and a range of discharge rates 1-6 kW; 2) battery service unit 106 commands battery pack 104 to self-discharge as described in the incorporated patent application; and 3) service personnel travel to onsite of battery pack 104 to safely discharge it manually.

Figure 6:
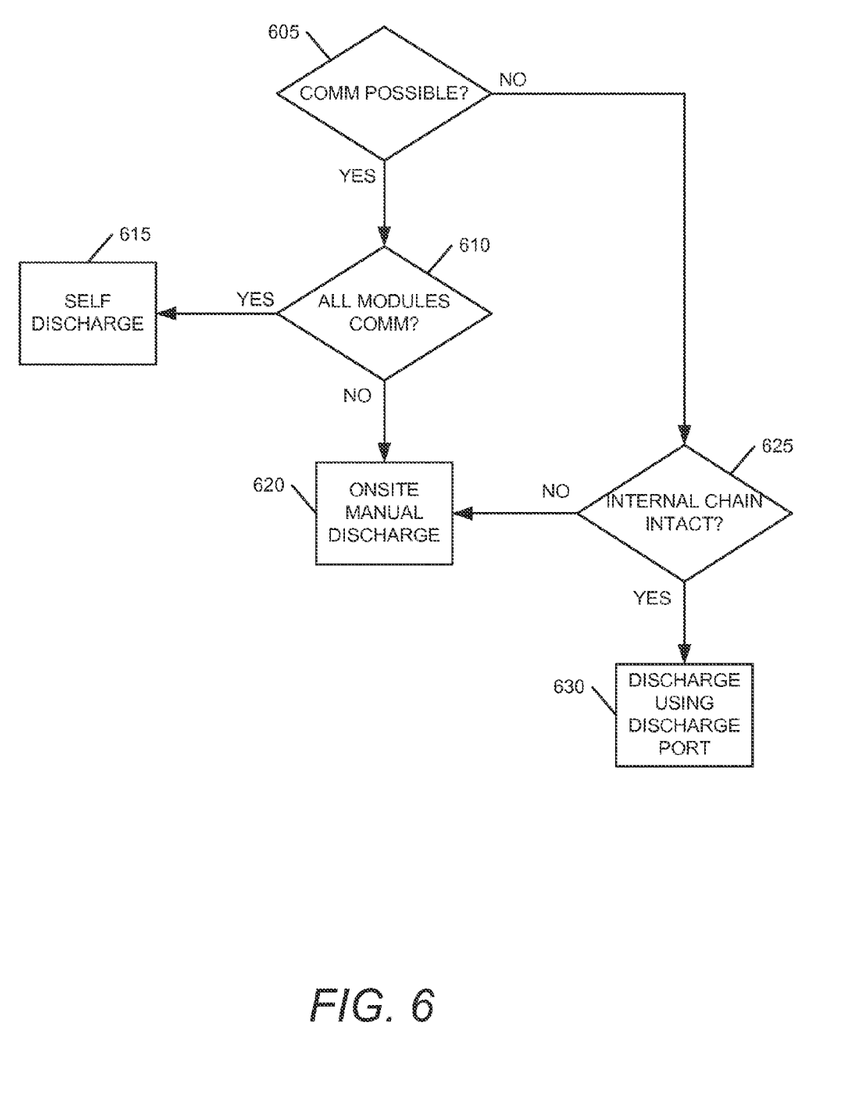
FIG. 6 illustrates a flowchart of a discharge process 600 for a non-functional battery pack 104.

FIG. 6 illustrates a flowchart of a discharge process 600 for a non-functional battery pack 104. Process 600 includes step 605—step 630. Process 600 begins at step 605 to test whether communication with BMS 325 is possible. When communication with BMS 325 is possible, process 600 next performs a test at step 610 to determine whether it is possible to communicate with all modules 302. When communication with all modules 302 is possible, process 600 commands battery pack 104 to perform a self-discharge option as described in option 2 above. When the test at step 610 determines it is not possible to communicate with all modules 302 (e.g., a module failure, wire damage, or the like), process 600 performs step 620 for an onsite manual discharge as described above in option 3. When the test at step 605 determines that it is not possible to communicate with BMS 325 (e.g., a failure of BMS 325 or a wire failure or the like), process 600 performs a test at step 625. The test at step 625 determines whether an internal high-voltage series module chain of modules 302 is intact. When the test at step 625 determines that the HV chain is intact, process 600 performs step 630 which uses battery service unit 106 to discharge battery pack 104 using the discharge port (e.g., the secondary port) as described above in option 1. When the test at step 625 determines that the HV chain is not intact (e.g., a fuse is blown or a cable is damaged, or the like), process 600 performs step 620 for an onsite manual discharge.

FIG. 7 illustrates an energy management scenario 700 for high-voltage battery pack 104 installed into an operating environment 705. Operating environment 705 includes a vehicle, load bank, or other implementation using a rechargeable high energy storage system. An exterior interface to operating environment 705 includes a primary access 710 and a secondary access 715.

An operator of service unit 106 has an option to interact with battery pack 104 installed in operating environment 705 using either primary access 710 or secondary access 715. Operating environment 705 includes a first processing system 720 that is a collection of processing, management, and safety systems. First processing system 720 includes contactors, fuses, filters, processors/controllers, and the like interposed between primary access 710 and battery pack 104. Some embodiments of operating environment 705 also optionally include a secondary processing system 725 associated with a collection of processing, management, and safety systems. Secondary processing system 725 includes contactors, fuses, filters, processors/controllers (e.g., battery management system), and the like interposed between secondary access 715 and battery pack 104. Some elements may be shared between first processing system 720 and secondary processing system 725.

For some energy management scenarios, battery pack 104 is physically secured and sealed within an enclosure. For performance and safety reasons, there are limited points of ingress and egress. A primary point of ingress and egress is an operational port 730. Operational port 730 provides controlled access to the energy storage components of battery pack 104. There may be contactors, fuses, filters, processors/controllers (e.g., battery management system), and the like controlling energy transfer through operational port 730, with those elements also represented by operational port 730. Some components may be provided in first processing system 720, operational port 730, or both. Operational port 730 includes primary HV port 108 and digital control interface 110.

It is through operational port 730 that standard charging and discharging events occur. The charging and discharging events are strictly controlled for enhanced safety and maximizing life expectancy for battery pack 104 without unduly limiting performance. In the context of an EV for the operating environment, some implementations of operational port 730 must receive a proper signature from operating environment 705 that represents that battery pack 104 is properly installed in the operating environment and functioning correctly. Service unit 106 has the ability to simulate or induce generation of this proper signature to enable energy transfers with respect to operational port 730. And in typical operation, rates of energy transfers using operational port 730 are sharply constrained within predetermined design limits to balance some of the competing interests.

These are some of the reasons that accessing stranded energy from battery pack 104 using operational port 730 is sometimes slower and more complex. Further, operating environment 705 sometimes experiences certain types of events that compromise access and use of primary access 710 and/or damages first processing system 720 and/or damages operational port 730.

To address any drawbacks with such scenarios, energy management scenario 700 includes a service port 735 installed at a strategic location of the enclosure for battery pack 104. Failure analyses of operating environment 705 and construction, layout, and reinforcement of the enclosure identify failure modes and associate service port 735 at locations that are least likely to be compromised whenever operating environment 705 experiences an event sufficient to make operational port 730 unavailable. Unavailability includes complete or partial damage that either makes battery pack 104 inaccessible or increases risks of accessing battery pack 104 through primary access 710 such that the risks exceed a predetermined threshold. Service port 735 includes secondary HV port 112.

In the embodiment illustrated in FIG. 7, service port 735 is configured in a discharge-only mode to remove or sufficiently reduce any stranded energy within battery pack 104. One way, among others, that this may be done is to include a discharge diode in secondary processing system 725 or service port 735 that limits energy transfers through secondary access 715 as discharge-only. This is different from operational port 730 which is illustrated as supporting bi-directional energy transfers (e.g., charging and discharging). As also discussed herein, some implementations may be configured as charging-only through secondary access 715 or configured also for bi-directional energy flow.

Service port 735 differs from operational port 730 in another respect. Service port 735 is intended for uses in which operational port 730 is not available and as such represents a contingent port. As a contingent port, supporting discharge events in potentially extreme situations, complexity is reduced and ease-of-use is increased, all the while preserving safety. One consequence of this reduced complexity is that some of the safeguards regarding constraints on discharging energy transfers (e.g., maximum energy transfer rate, SOC low energy targets and thresholds, and the like) are not present or disabled. These considerations are secondary at best to the goal of removing stranded energy from battery pack 104 in an emergency/urgent situation.

The reduced complexity enables simpler operation and simpler requirements for service unit 106, increasing the accessibility and use in this configuration. In certain cases, such as collision, or emergency/urgent event, then first responders may respond more quickly and second responders may remove stranded energy more simply and a version of service unit 106 capable of maintaining a desired energy level (including removing stranded energy) for battery pack 104 is simpler to operate and could be made less costly and thereby increase availability of the service unit 106.

Some details of the internal layout of battery pack 104 are illustrated in FIG. 3, with operational port 730 associated with the primary power connector and the interface connector and service port 735 associated with the secondary power connector. Service port 735 is coupled to a "cell" side of contactors 320 while operational port 730 is coupled to contactors 320 interposed to modules 302.

When installed, battery pack 104 is typically mechanically and electrically secured in operating environment 705, such as mounted to a portion of a chassis inside an EV. Operating environment 705 thus limits easy access to operational port 730 and to service port 735. Operating environment 705 thus provides electro-mechanical interfaces between primary access 710/secondary access 715 and battery pack 104. These electro-mechanical interfaces include conductors (e.g., a plus voltage conductor and a negative voltage conductor) and a common implementation for couplers to such electro-mechanical interfaces is use of plugs having pins that mate to complementary receptacles to provide electrical communication.

Operational port 730 provides the principal access and its electro-mechanical interface is defined and implemented for frequent use. Primary access 710 is configured for easy and simple access by the user, such as when charging at a charging station.

Service port 735 in contrast is intended for specialized limited access. Service port 735 is coupled into battery pack 104 differently than operational port 730 as noted herein, and those differences increase risks to battery pack 104 whenever service port 735 is used. For example, it is possible that discharging energy from battery pack 104 using service port 735 could disables or severely limits future operation of battery pack 104, especially if the discharging event is aggressive (e.g., high energy transfer rate). Some implementations of the mechanical interface provide enhanced grounding when employing service port 735. For example, the mechanical features of secondary access 715 may first ground a battery chassis before making electrical contact with any power conductors.

Some embodiments include special interface requirements for service port 735 and/or secondary access 715. These requirements are intended to prevent or limit access to battery pack 104 using service port 735. Some of these requirements may include installation of secondary access 715 at a hidden location in the operating environment to thus secure access to secondary access 715 so that is may be accessed only by use of a special tool. Some embodiments include use of an electro-mechanical interface with different plug/receptacle form factors from those used with primary access 710.

Some embodiments include use of a tamper evident technology to secure service port 735 and limit use. One such implementation may include installation of a tamper evident label securing secondary power connector and preventing use unless the label is removed. The label providing suitable warnings, use instructions, and in some cases, identification of an access protocol to limit negative consequences of accessing battery pack 104 through service port 735.

Figure 8:
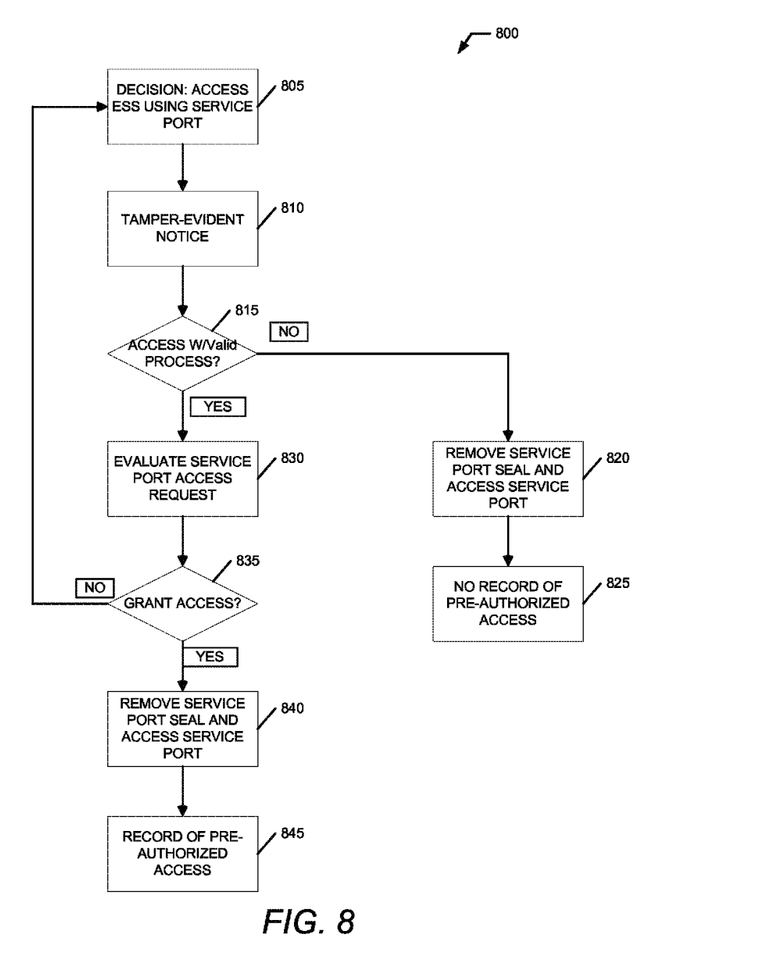
FIG. 8 illustrates a service port access process 800.

FIG. 8 illustrates a service port access process 800. Process 800 includes steps 805-845 that may be automated or implemented by a technician, service engineer, or other qualified individual. Process 800 begins at step 805 when evaluation of energy management scenario 700 establishes a desirability of using service port 735 instead of operational port 730. After step 805, process 800 implements step 810 in which tamper-evident technology is employed to warn against use of service port 735 in inappropriate ways. For example, a tamper-evident label may be installed on battery pack 104, secondary access 715, or other interlocking element of operating environment 705. The label identifies an access protocol and may include cautions and best practices for use of service port 735. Some embodiments include a contact reference (e.g., a phone number, email, web-access, or other methodology) in which authorization (automated or manual) may be obtained.

Process 800 includes a test at step 815 as to whether the further actions are consistent with the identified access protocol. When the test at step 815 is negative then process 800 branches to step 820. Step 820 includes accessing service port 735, such as by removing or otherwise defeating the tamper-evident technology. Process 800 includes a step 825 noting that the access at step 820 was conducted without a record of pre-authorization. This can have consequences, such as voiding a warranty or increasing costs of subsequent servicing.

When the test at step 815 was affirmative then process 800 branches to step 830. At step 830, there is an automated or manual evaluation of the requested access, such as by the manufacturer or authorized representative. After the evaluation of step 830 then process 800 includes a test at step 835 based upon whether access to service port 735 is granted/authorized. When the test at step 835 is negative, process 800 may terminate or return to step 805 to collect more information or reconsider a desirability of access to service port 735.

When the test at step 835 is affirmative, then process 800 advances to step 840 to defeat the tamper-evident technology (e.g., remove the label) and access service port 735. Process 800 includes a step 845 noting that the access at step 840 was conducted with a record of pre-authorization. (The authorization recorded at step 840 such as by providing an access code, associating a service record, or the like.) The pre-authorization eliminates any of the unauthorized consequences referenced herein.

While examples and implementations have been described, they should not serve to limit any aspect of the present invention. Accordingly, implementations of the invention can be implemented in digital electronic circuitry, or in computer hardware, firmware, software, or in combinations thereof. Apparatus of the invention can be implemented in a computer program product tangibly embodied in a machine readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read only memory and/or a random access memory. Generally, a computer will include one or more mass storage devices for storing data files; such devices include magnetic disks, such as internal hard disks and removable disks; magneto optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto optical disks; and CD ROM disks. Any of the foregoing can be supplemented by, or incorporated in, ASICs.

The system and methods above has been described in general terms as an aid to understanding details of preferred embodiments of the present invention. In the description herein, numerous specific details are provided, such as examples of components and/or methods, to provide a thorough understanding of embodiments of the present invention. Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. A rechargeable high-voltage battery pack, comprising:
   a plurality of series-coupled energy storage elements;
   an interlock having a first node and a second node, said first node coupled to said plurality of series-coupled energy storage elements with said interlock responsive to a control signal to control a power communication of said first node to said second node, said interlock enabling said communication with said control signal in a first mode and said interlock disabling said power communication with said control signal in a second mode;

a housing enclosing and sealing said plurality of series-coupled energy storage elements and said interlock with a plurality of exterior walls;

an operational port coupled to a portion of a first particular one exterior wall of said plurality of exterior walls, said operational port coupled to said second node and providing a first energy transfer with respect to said plurality of series-coupled energy storage elements only when said power communication is enabled; and a service port coupled to a portion of a second particular one exterior wall of said plurality of exterior walls, said service port coupled to said first node and providing a second energy transfer with respect to said plurality of series-coupled energy storage elements without regard to whether said power communication is enabled;

wherein said service port includes an energy transfer direction control limiting said second energy transfer to a single direction, and wherein said single direction discharges said a plurality of series-coupled energy storage elements through said service port.

2. The rechargeable high-voltage battery pack of claim 1 further comprising a battery management system selectively asserting said control signal.

3. The rechargeable high-voltage battery pack of claim 2 wherein said interlock includes a plurality of contactors selectively opening and closing responsive to said control signal, said plurality of contactors closed to enable said power communication and open to disable said power communication.

4. The rechargeable high-voltage battery pack of claim 1 further comprising an operating environment supporting said housing, said operating environment including:
    a primary charging connector;
    a first electro-mechanical interface coupling said primary charging connector to said operational port;
    a secondary charging connector; and
    a second electro-mechanical interface coupling said secondary charging connector to said service port.

5. The rechargeable high-voltage battery pack of claim 4 further comprising a battery management system selectively asserting said control signal.

6. The rechargeable high-voltage battery pack of claim 5 wherein said interlock includes a plurality of contactors selectively opening and closing responsive to said control signal, said plurality of contactors closed to enable said power communication and open to disable said power communication.

7. The rechargeable high-voltage battery pack of claim 6 wherein said battery management system includes an electronic lock responsive to a digital signature, said electronic lock inhibiting assertion of said control signal absent an assertion of said digital signal to said battery management system.

8. The rechargeable high-voltage battery pack of claim 7 wherein said operating environment asserts said digital signature to said battery management system.

9. The rechargeable high-voltage battery pack of claim 4 including a tamper-evident seal coupled to said secondary charging connector with said tamper-evident seal visually indicating use of said service port.

10. A method for managing a rechargeable high-voltage battery pack, comprising:
    a) configuring the rechargeable high-voltage battery pack to transfer energy with respect to an exterior operational port through an interlock; and
    b) bypassing said interlock to transfer energy between the rechargeable high-voltage battery pack and an exterior service port without using said operational port to transfer energy relative to the rechargeable high-voltage battery pack;
    wherein said exterior service port includes an energy transfer direction control limiting said transfer of energy to a single direction, and wherein said single direction discharges said rechargeable high-voltage battery pack through said exterior service port.

11. The method of claim 10 wherein said operational port supports bidirectional energy transfers with respect to the rechargeable high-voltage battery pack, further comprising:
    c) limiting said transfer of energy of said bypassing step to the single direction only.

12. The method of claim 10 wherein the rechargeable high-voltage battery pack is installed in an operating environment, said operating environment including a primary exterior-accessible power connector communicated to said operational port and a secondary exterior-accessible power connector communicated to said service port.

13. The method of claim 12 further comprising:
    d) protecting said secondary exterior-accessible power connector using a tamper-evident closure that provides a visual indication of a use of said service port.

\* \* \* \* \*